(12) United States Patent
Urano

(10) Patent No.: US 7,947,586 B2
(45) Date of Patent: May 24, 2011

(54) METHOD OF MANUFACTURING A SEMICONDUCTOR DEVICE

(75) Inventor: Yuichi Urano, Nagano (JP)

(73) Assignee: Fuji Electric Systems Co., Ltd. (JP)

( * ) Notice: Subject to any disclaimer, the term of this patent is extended or adjusted under 35 U.S.C. 154(b) by 0 days.

(21) Appl. No.: 12/700,044

(22) Filed: Feb. 4, 2010

(65) Prior Publication Data

US 2010/0197127 A1    Aug. 5, 2010

(30) Foreign Application Priority Data

Feb. 4, 2009    (JP) .................................. 2009-023833

(51) Int. Cl.
*H01L 21/20* (2006.01)

(52) U.S. Cl. ...................... 438/584; 438/678; 155/272.6; 155/308.6; 155/309.3; 257/E21.159; 427/531; 427/536

(58) Field of Classification Search .................. None
See application file for complete search history.

(56) References Cited

U.S. PATENT DOCUMENTS

| 6,537,411 B1 * | 3/2003 | Kang et al. ................. 156/272.6 |
| 2004/0192012 A1 | 9/2004 | Takezoe et al. |
| 2004/0256730 A1 | 12/2004 | Hirano et al. |
| 2005/0158979 A1 * | 7/2005 | Momota et al. ............... 438/614 |
| 2005/0170612 A1 | 8/2005 | Miyanari et al. |
| 2005/0233547 A1 | 10/2005 | Noda et al. |

FOREIGN PATENT DOCUMENTS

| JP | 2003-173993 A | 6/2003 |
| JP | 2004-064040 A | 2/2004 |
| JP | 2005-019798 A | 1/2005 |
| JP | 2005-191550 A | 7/2005 |
| JP | 2006-156772 A | 6/2006 |
| JP | 3831846 B2 | 10/2006 |
| JP | 2007-317964 A | 12/2007 |

* cited by examiner

*Primary Examiner* — Charles Garber
*Assistant Examiner* — Yasser A Abdelaziez
(74) *Attorney, Agent, or Firm* — Rossi, Kimms & McDowell LLP

(57) ABSTRACT

A method of manufacturing a semiconductor device is disclosed, wherein a plating layer is formed on a first surface side of a semiconductor substrate stably and at a low cost, while preventing the plating liquid from being contaminated and avoiding deposition of uneven plating layer on a second surface side. An electrode is formed on the first surface of the semiconductor substrate, and another electrode is formed on the second surface. A curing resin is applied on the electrode on the second surface and a film is stuck on the curing resin, and the curing resin is then cured. After that, a plating process is conducted on the first surface. The film and the curing resin are then peeled off.

12 Claims, 7 Drawing Sheets

Fig. 1

S101 formation of front surface structure of the element

S102 back grinding

S103 rear surface etching

S104 rear surface ion implantation

S105 heat treatment

S106 removal of rear surface oxide film

S107 rear surface electrode deposition

S108 curing resin application

S109 film sticking

S110 curing of the curing resin (UV irradiation onto the rear surface)

S111 plating on the front surface side (nickel plating and gold plating)

S112 peeling off of the rear surface protective film

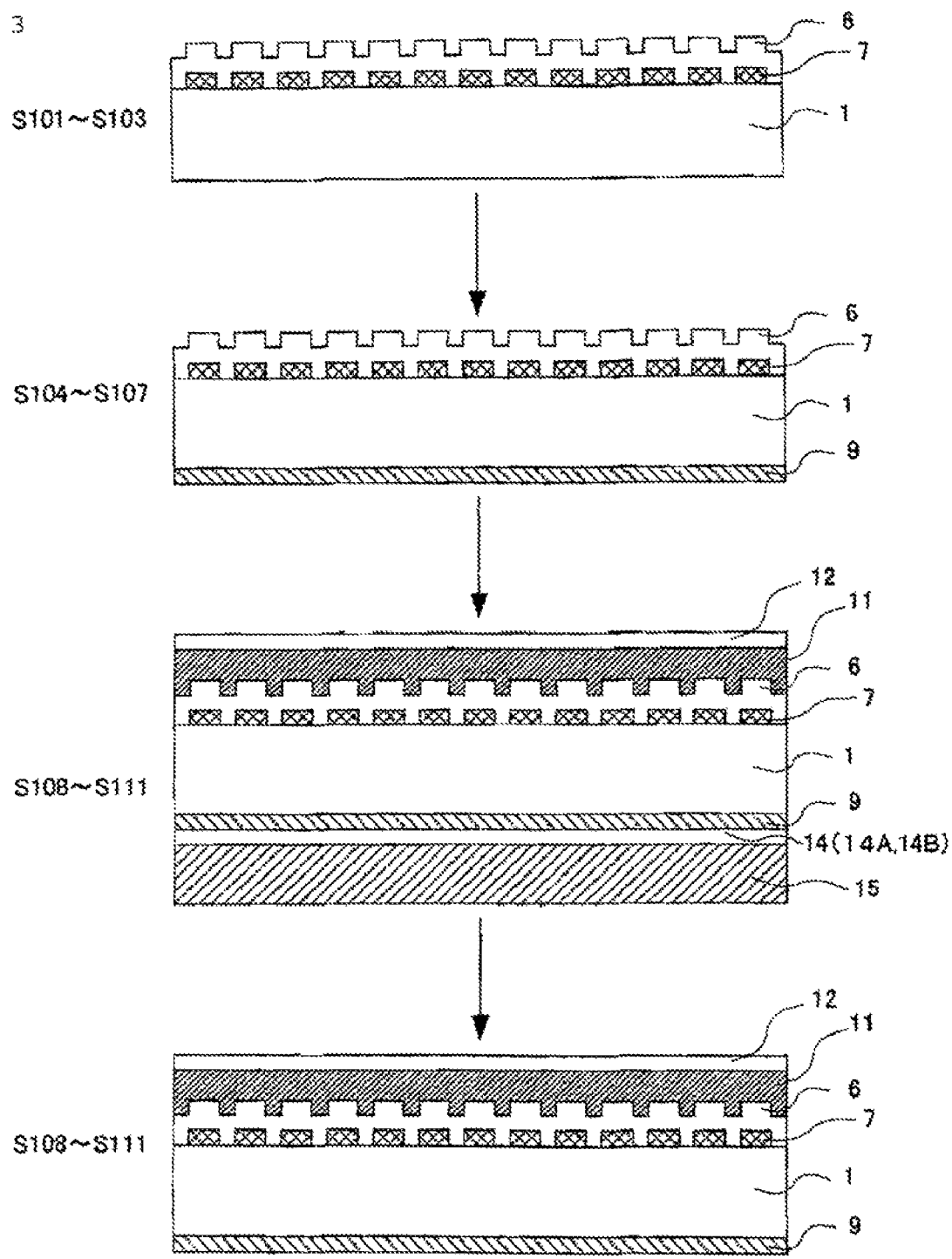

Fig. 4

S101 formation of front surface structure of the element

S102 back grinding

S103 rear surface etching

S104 rear surface ion implantation

S105 heat treatment

S106 removal of rear surface oxide film

S107 rear surface electrode deposition

S108 curing resin application

S109 film sticking

S120 curing of the curing resin (heating)

S111 plating on the front surface side (nickel plating and gold plating)

S112 peeling off of the rear surface protective film

Fig. 7

S301 formation of front surface structure of the element

S302 back grinding

S303 rear surface etching

S304 rear surface ion implantation

S305 heat treatment

S306 removal of rear surface oxide film

S307 rear surface electrode deposition

US 7,947,586 B2

METHOD OF MANUFACTURING A SEMICONDUCTOR DEVICE

BACKGROUND OF THE INVENTION

A. Field of the Invention

The present invention relates to a method of manufacturing a semiconductor device, in particular to a method of manufacturing a power semiconductor element, a type of a semiconductor device, which has electrodes on the front surface side and the rear surface side, and a plating layer formed on the electrode on the front surface side.

B. Description of the Related Art

Power semiconductor devices generally used in power conversion apparatuses include the semiconductor elements that perform a switching operation such as power MOSFETs (metal oxide semiconductor field effect transistors) and IGBTs (insulated gate bipolar transistors), and the FWD (free wheeling diode) used in combination with those elements.

The IGBT is a power semiconductor element that exhibits a high speed switching characteristic and a voltage-driving characteristic, which are possessed by a MOSFET, and a low on-voltage characteristic possessed by a bipolar transistor.

In the following description, a semiconductor region prefixed by "n" or "p" is a region in which the majority carrier is an electron or a positive hole, respectively. The sign "+" or "−" added to the symbols n and p such as n+ or n− means that the impurity concentration of a region with the sign is larger or smaller, respectively, than that of a region without the sign.

There are three types of structures of an IGBT: a punch-through type (abbreviated to a "PT" type in the following description), a non-punch-through type (abbreviated to a "NPT" type in the following description), and a field-stopping type (abbreviated to an "FS" type in the following description). A PT type IGBT uses an epitaxial substrate having an n+ buffer layer and an n− active layer, each being epitaxially grown on the surface of a p+ semiconductor substrate. A power semiconductor element of an IGBT for a withstand voltage of 600 V class has an active layer with a thickness of about 100 μm and a total thickness including a p+semiconductor substrate in the range of 200 μm to 300 μm. The PT type IGBTs, which are manufactured using an epitaxial substrate, are expensive.

Another method is known for manufacturing an NPT type IGBT and an FS type IGBT to use a floating zone substrate (abbreviated to an "FZ" substrate in the following description). The FZ substrate is cut out from a semiconductor ingot manufactured by a floating zone method. These types of IGBTs have a shallow p+ collector layer formed in the rear surface side of the substrate with a low dose.

Next, a structure of an NPT type IGBT is described. FIG. 5 is a sectional view showing a structure of an NPT type IGBT, which is manufactured using an FZ substrate. Referring to FIG. 5, the reference numeral 1 designates an n-type FZ substrate, which is an n− drift layer. The n− drift layer works as an active layer. The reference numeral 2 designates a p+ base region, the numeral 3 designates an n+ emitter region, 4 a gate oxide film, 5 a gate electrode, 6 an emitter electrode, and the reference numeral 7 designates an interlayer insulation film.

The p+ base region 2 is selectively provided in the surface region of n− drift layer (FZ substrate) 1. N+ emitter region 3 is selectively provided in the surface region of the p+ base region 2.

The side of FZ substrate 1 in which n+ emitter region 3 is provided is defined as a front surface side of FZ substrate 1. On the surface of the front surface side of substrate 1, gate electrode 5 is provided through underlying gate oxide film 4. On gate electrode 5, interlayer insulation film 7 is provided. Emitter electrode 6 is provided in contact with p+ base region 2 and n+ emitter region 3 and insulated from the gate electrode by interlayer insulation film 7.

A surface opposite to the front surface of FZ substrate 1 is the rear surface. On the rear surface of FZ substrate 1, p+ collector layer 8 and collector electrode 9 are provided.

Next, a structure of an FS type IGBT is described. FIG. 6 is a sectional view showing a structure of an FS type IGBT, which is again manufactured using an FZ substrate as the device of FIG. 5.

Referring to FIG. 6, the reference numeral 1 designates the n type FZ substrate, which is an n− drift layer. The n− drift layer works as an active layer. The reference numeral 2 designates a p+ base region, the numeral 3 an n+ emitter region, 4 a gate oxide film, 5 a gate electrode, 6 an emitter electrode, and 7 an interlayer insulation film. Relative positions among these parts are similar to those in FIG. 5 and description is omitted.

FIG. 6 is different from FIG. 5 in that an n buffer layer 10 is provided between n− drift layer 1 (FZ substrate) and p+ collector layer 8 in the rear surface region of FZ substrate 1.

The NPT type IGBT and the FS type IGBT, which are manufactured using FZ substrate 1, have a total thickness greatly reduced from that of the PT type IGBT. Specifically, an FS type IGBT has a total thickness in the range of 80 μm to 200 μm.

A power semiconductor element for a withstand voltage of 600 V class, for example, has a total thickness of the FZ substrate 1 of about 100 μm. Since the injection rate of positive holes can be controlled, high speed switching is performed without lifetime control. Power semiconductor elements that use an FZ substrate, which is inexpensive as compared with an epitaxial substrate, can be provided more cheaply than power semiconductor elements that use an epitaxial substrate.

Now, a method of manufacturing an FS type IGBT is described. FIG. 7 is a flow chart showing steps of a method of manufacturing an FS type IGBT.

First in step S301, the parts in the front surface side of FZ substrate 1 shown in FIG. 6 are formed including p+ base region 2, n+ emitter region 3, gate oxide film 4, gate electrode 5, emitter electrode 6, and interlayer insulation film 7. The structure inclusive of all these parts is referred to as a front surface structure.

Then, in step S302, the rear surfaced side of FZ substrate 1 is ground (back-grinding) to reduce a thickness of FZ substrate 1. For example, FZ substrate 1 with a thickness of 600 μm is ground to about 120 μm. In order to eliminate the damage on the substrate surface such as strain caused by the grinding process, the rear surface side of FZ substrate 1 is removed by an etching process. The etching process removes 20 μm, for example. Although the etching process can be carried out by either wet etching or dry etching, a wet etching process is conducted in this example in step S303.

On the rear surface side of FZ substrate 1, which has been cleaned after completion of the etching process, two types of ions are successively injected (ion-implantation) in step S304. After the ion-implantation, an activating heat treatment is conducted to form n buffer layer 10 and p+ collector layer 8 in step S305.

Then, collector electrode 9 is formed in step S307 on the surface of p+ collector layer 8 by laminating a metal by means of an evaporation method or a sputtering method. The metallic layer laminated on the surface of p+ collector layer 8 is, for example, a lamination of aluminum, titanium, nickel, and gold deposited in this order. Prior to laminating the metallic layer, it is preferable to remove a natural oxide film formed on the surface layer of p+ collector layer 8 using dilute hydrofluoric acid in step S306.

An aluminum layer in the metallic layer is preferably composed of an aluminum-silicon layer containing silicon with a content in the range from 0.5 wt % to 2 wt %, more preferably at most 1 wt %.

This material is used in order to avoid aluminum spike. The aluminum spike is formed in the process of forming an aluminum layer or in heat treatment process after forming the aluminum layer, in which aluminum penetrates from the aluminum layer into the underlying semiconductor substrate of silicon. If this aluminum spike pierces through the pn junction between n buffer layer 10 and p+ collector layer 8 in the rear surface side of an FS type IGBT, degradation of electric performance, for example increase in leakage current is caused in the FS type IGBT.

An aluminum layer composed of an aluminum-silicon layer containing silicon prevents the aluminum spike from extending into the underlying semiconductor substrate. The titanium layer prevents nickel of the upper layer from diffusing into the aluminum layer that is an aluminum-silicon layer. The nickel layer is provided for solder joining to an external terminal (not shown in FIG. 6). The gold layer on the nickel layer inhibits oxidation of the nickel layer.

When a chip of a power semiconductor device is packaged, the chip is connected to a circuit pattern and conductor strips (hereinafter, generally referred to as external terminals) on an insulation board. For example, a collector electrode in the rear surface side of a power semiconductor element is connected to an external terminal by solder joining and an emitter electrode in the front surface side is connected to an external terminal by wire bonding using an aluminum wire in conventional technologies.

In order to achieve high density packaging of a module package, enhancement of current density, reduction of wiring capacitance for high speed switching, and improvement in cooling efficiency of a semiconductor element, a method of joining electrodes on the front surfaced side to external terminals by solder joining has been proposed.

Use of the solder joining for connection between a power semiconductor element and external terminals in place of the wire-bonding obviates a space required by distribution wires in the wire-bonding to minimize the volume of the module package. In addition, a wiring capacitance of a connection part between the power semiconductor element and the external terminals is also minimized. While an electric current fed in a bonding wire in the wire-bonding is restricted because of an electric resistance in the bonding wire, the solder joining can enhance the current density. Moreover, the external terminal (for example, a copper plate) can be directly cooled with cooling water, greatly improving cooling efficiency of the semiconductor element.

In order to perform the solder joining between the electrode on the front surface side of the power semiconductor element and the external terminal, it is necessary to provide it with a metallic layer (of nickel, for example) exhibiting a good wettability on the surface of the electrode on the front surface side. Japanese Unexamined Patent Application Publication No. 2005-019798 discloses formation of a metallic layer with good wettability by means of a plating method.

A technique of electroless plating can be employed for forming a plating of the metallic layer on the front surface side of the semiconductor substrate in a step of manufacturing a power semiconductor element. In the electroless plating, if a part of the surface of the semiconductor substrate is exposed at a dicing line for cutting the semiconductor substrate into individual pieces of power semiconductor elements, a plating layer grows on the surface of the dicing line, which is at an equal potential to the front surface side of the substrate. A plating layer also grows on the outer periphery of the semiconductor wafer on which no power semiconductor element is formed. There is further possibility of plating layer growth even on the rear surface side of the semiconductor substrate. A plating layer formed on the peripheral region or on the rear surface of the semiconductor substrate causes a problem of non-uniformity of the plating layer formed on the front surface side of the semiconductor substrate.

In order to suppress the non-uniformity, Japanese Unexamined Patent Application Publication No. 2006-156772 and Japanese Patent No. 3831846 disclose a technique to cover the dicing line and the peripheral face of the semiconductor substrate with an insulation film or a resin. However, even when the dicing line on the front surface side and the peripheral side face of the semiconductor substrate are covered with the insulation film or the resin, there is still the possibility of plating on the rear surface side of the semiconductor substrate, which is not activated for the electroless plating liquid. This plating can occur from nuclei of residue of zinc that remains due to insufficient cleaning after zinc substitution treatment in a double zincate treatment, which is a preliminary treatment for the electroless nickel plating. The suspension in the electroless plating liquid can also be the nucleus for this undesired plating.

The abnormal plating layer of nickel, for example, deposited on unintended places may occasionally be peeled off from the electrode on the rear surfaced side of the semiconductor substrate and falls down into the electroless plating liquid by oscillation of the substrate in the electroless plating liquid. Each fallen nickel piece becomes a nucleus to initiate continuing precipitation of nickel in the plating bath, which decreases the nickel concentration in the plating bath.

In the electroless plating, a treatment time for obtaining a desired thickness of the plating layer is determined based on a preliminarily measured deposition rate. If the concentration in the plating liquid changes, the deposition rate of the plating layer changes as well. As a result, the pre-determined treatment time is insufficient for obtaining a plating layer with the desired thickness. Therefore, when the nickel has fallen down into the plating liquid, it becomes necessary to wash the plating bath and replace the plating liquid.

In order to cope with this problem and to carry out plating exclusively on the front surface side of the semiconductor element, a technique has been proposed in which a dedicated jig is used which has a structure to prevent the plating liquid from circulating behind the rear surface side of the semiconductor substrate, and the substrate is fastened with the jig. Another method has been proposed in which a resist is applied on the places where the plating is not to be formed, such as the rear surface and the side plane of the semiconductor substrate. The electroless plating is conducted after forming a protective film of the resist.

Japanese Unexamined Patent Application Publication No. 2005-191550 and Japanese Unexamined Patent Application Publication No. 2007-317964 disclose a technique in which an adhesive liquid is spread onto a surface of the semiconductor substrate opposite to the surface of treatment and is preliminarily dried for reducing flowability, thus maintaining the shape as an adhesive layer. Then, a support plate is stuck to the adhesive layer.

Japanese Unexamined Patent Application Publication No. 2003-173993 discloses another method which uses a support plate for protecting a semiconductor wafer. The support plate is stuck on the wafer with a tape for protecting a surface of the semiconductor wafer opposite to the surface to be treated. The tape has an adhesive material layer that is formed on one surface of the base material of the tape and contains a gas-generating agent that generates a gas on receiving light.

Japanese Unexamined Patent Application Publication No. 2004-064040 discloses still another method in which a joining layer is formed on the surface of the semiconductor wafer opposite to the surface to be treated. Then, the semiconductor wafer is stuck, with the joining layer, to a light transmissive support such as a glass plate that has a photo-thermal conversion layer containing a light absorber and a thermally decomposable resin.

However, a semiconductor substrate having a thickness as thin as in the range of 80 µm to 200 µm has been warped through the prior steps. When the semiconductor substrate is fastened interleaved between a dedicated jig having a structure for preventing the plating liquid from circulating around the rear surface side of the substrate, such a thin warped semiconductor substrate may be broken or chipped in the process of interleaving and fastening between the dedicated jig. Consequently, the manipulation of interleaving can hardly automated and a hand work by a worker is necessary. Thus, the method requires much time and labor, and is not suited for mass production.

In the method of applying a resist for a protective film mentioned earlier, the adhesiveness between the resist and a metal layer for an electrode already formed on the rear side surface of the semiconductor substrate is low. As a result, the resist peels off from the semiconductor substrate in the electroless nickel plating process, which is conducted at a temperature around 80° C. In addition, an organic solvent component in the resist dissolves in the plating liquid, contaminating the plating liquid. The contamination of the plating liquid with an organic solvent causes poor adhesion between the plating layer and an underlying layer, swelling of the plating layer, little precipitation of the plating layer, slow rate of precipitation, uneven luster and cloudiness on the plating surface, and abnormal precipitation of the plating. Therefore, the contaminated plating liquid needs to be replaced and the plating bath must be washed. Since the resist is expensive, the manufacturing cost of a power semiconductor element increases. Moreover, a thin semiconductor substrate having a thickness at most 200 µm, when the protective film is formed with a resist, warps due to stress generated in the process of curing the resist, causing difficulty in automated transportation of the semiconductor substrate.

The above-described problems exist not only in the electroless nickel plating, but also in the plating of other metals such as gold plating.

There is a problem described below in the method in which an adhesive liquid is spread onto a surface of a semiconductor substrate opposite to the surface of treatment and is preliminarily dried to reduce flowability while maintaining the shape as an adhesive layer followed by sticking of a support plate to the substrate surface. Since the adhesive layer in this method needs to be dissolved with alcohol in the step for peeling off the support plate from the semiconductor substrate, the support plate has a multiple of small holes across the plate from the non-adhering surface to the adhering surface formed over the entire surface thereof. If this structure is applied to electroless plating, where a solution of a strong acid of nitric acid or a strong alkali of sodium hydroxide is used, this agent reaches the adhesive layer through the multiple of holes. The adhesive layer touched the agent dissolves and loses its adhesivity causing peel off of the support plate, and further the plating liquid is contaminated.

There is a problem described below in the method for protecting the rear surface of a semiconductor substrate by sticking a support plate on the rear surface of the substrate using a tape stuck on the surface of the substrate opposite to the surface to be treated. The tape has adhesive material layers formed on both surfaces of the base material thereof. One of the two adhesive material layers that is to be stuck on the substrate contains a gas generating agent to generate a gas upon receiving light. When the tape containing a gas generating agent, is used with the support plate stuck thereon and is immersed in the plating bath for electroless nickel plating or electroless gold plating with a plating liquid at a temperature in the range of 70° C. to 90° C., the gas generating agent generates a gas responding to the temperature in the plating process and the support plate is peeled off.

There is a problem described below in the method for protecting a rear surface of a semiconductor substrate by forming a joining layer on the surface of the semiconductor substrate opposite to the surface to be treated and sticking a light transmissive support to the substrate through the joining layer. In order to peel off the light transmissive support from the joining layer, an adhering surface of the light transmissive support is provided with a photo-thermal conversion layer preliminarily formed thereon, the photo-thermal conversion layer containing a light absorber and a thermally decomposable resin. Glass is used for the light transmissive support. In this method, the light transmissive support is expensive; the cost for forming the photo-thermal conversion layer on the glass is high; and when the light transmissive support is recycled, the cost for cleaning the decomposed photo-thermal conversion layer is high. Thus, a manufacturing cost employing the method is expensive on the whole. Moreover, the joining layer remained on the semiconductor substrate must be peeled off with a peeling tape or the like in an additional process after peeling off the light transmissive substrate.

The present invention is directed to overcoming or at least reducing the effects of one or more of the problems set forth above.

SUMMARY OF THE INVENTION

It is therefore an object of the present invention to solve the above-described problems in the conventional plating methods and provide a method of manufacturing a semiconductor device in which when a plating process is conducted on one surface side of a substrate, the plating liquid is prevented from contamination and the other surface side of the substrate is prevented from precipitation of non-uniform plating layer thereby forming a stable plating layer on the one surface side of the substrate at a low cost.

To accomplish the above object, a method of manufacturing a semiconductor device according to the invention comprises steps of: forming a semiconductor element on a semiconductor substrate; forming a first electrode mainly composed of aluminum on a first principal surface of the semiconductor substrate; forming a second electrode on a second principal surface of the semiconductor substrate; applying a curing resin on the second electrode; sticking a film on the curing resin; curing the curing resin after sticking the film; plating on the first electrode; and peeling off the film and the curing resin from the second electrode after the step of plating It is preferable in the method of the invention that an adhering force between the curing resin after curing and the film is greater than an adhering force between the curing resin after curing and the second electrode. Preferably, the method of the invention in this situation further comprises a step of preliminarily treating a surface of the film on which the curing resin is to be stuck, for enhancing adhesiveness of the film with the curing resin, before the step of sticking the film on the curing resin. Preferably, the step of the treatment for enhancing adhesiveness is carried out by corona discharge on the surface on which the curing resin is to be stuck.

Preferably, the film has a rigidity allowing deformation that follows a warping configuration of the semiconductor substrate.

The method of the invention prevents the plating liquid from contamination in the process of plating treatment on one surface side of the substrate. The method of the invention prevents the other surface side of the substrate from precipitation of non-uniform plating layer and forms a stable plating layer on the one surface side of the substrate at a low cost.

BRIEF DESCRIPTION OF THE DRAWINGS

The foregoing advantages and features of the invention will become apparent upon reference to the following detailed description and the accompanying drawings, of which:

FIG. 1 is a flow chart showing steps of a method of manufacturing a semiconductor device according to the invention;

FIG. 3 shows sectional views in the processes corresponding to the successive steps of the flow chart in FIG. 1;

FIG. 4 is a flow chart showing steps of another method of manufacturing a semiconductor device according to the invention;

FIG. 7 is a flow chart showing steps of a method of manufacturing a field stop (FS) type IGBT.

DETAILED DESCRIPTION OF SPECIFIC EMBODIMENTS

The invention will be described in detail in the following showing some preferred embodiments illustrated in the accompanying drawings.

FIG. 1 is a flow chart showing steps of a method of manufacturing a semiconductor device according to the invention. The manufacturing method manufactures, for example, an FS type IGBT shown in FIG. 2.

Figure 2:
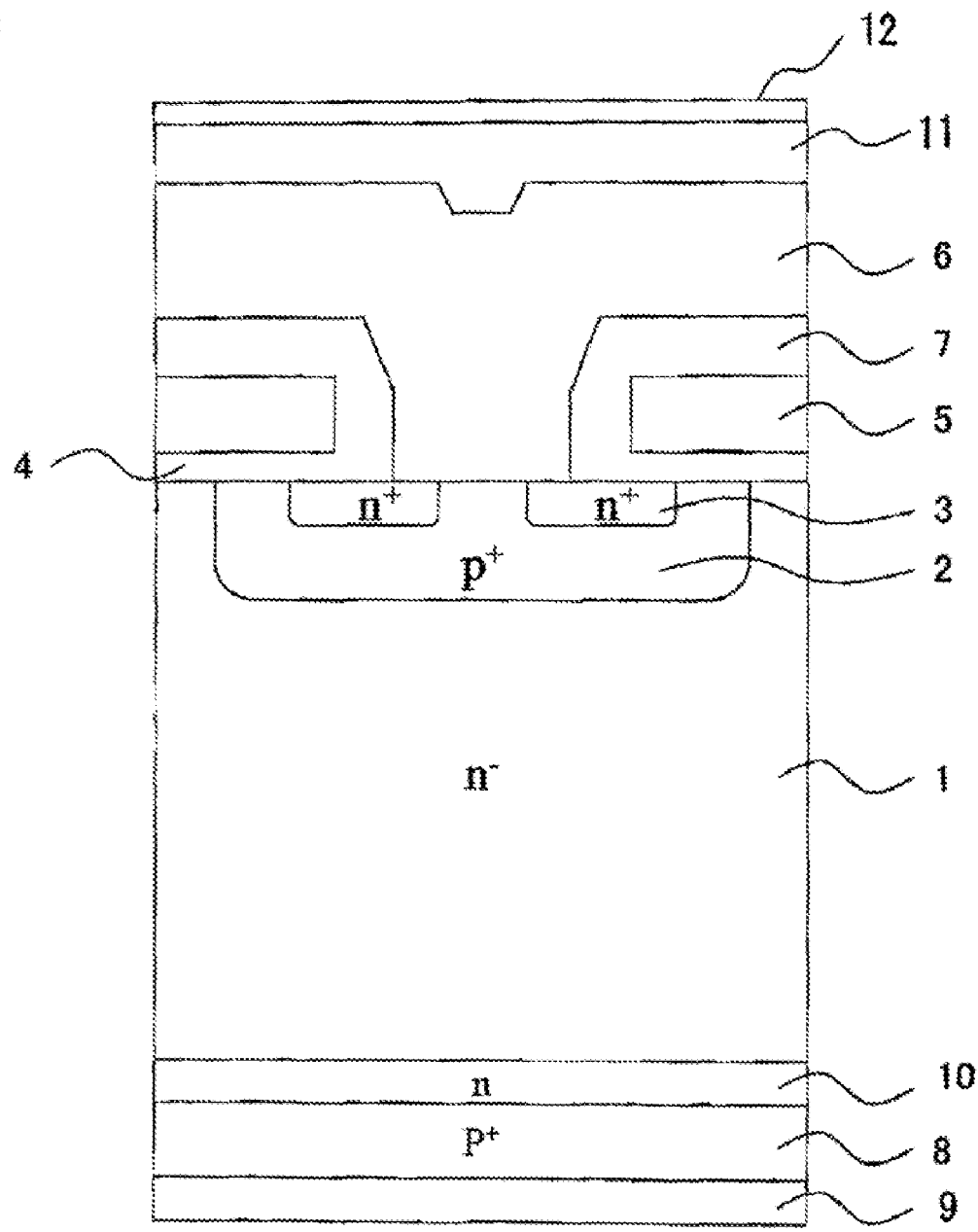
FIG. 2 is a sectional view of a structure of a field stop (FS) type IGBT.
Figure 5:
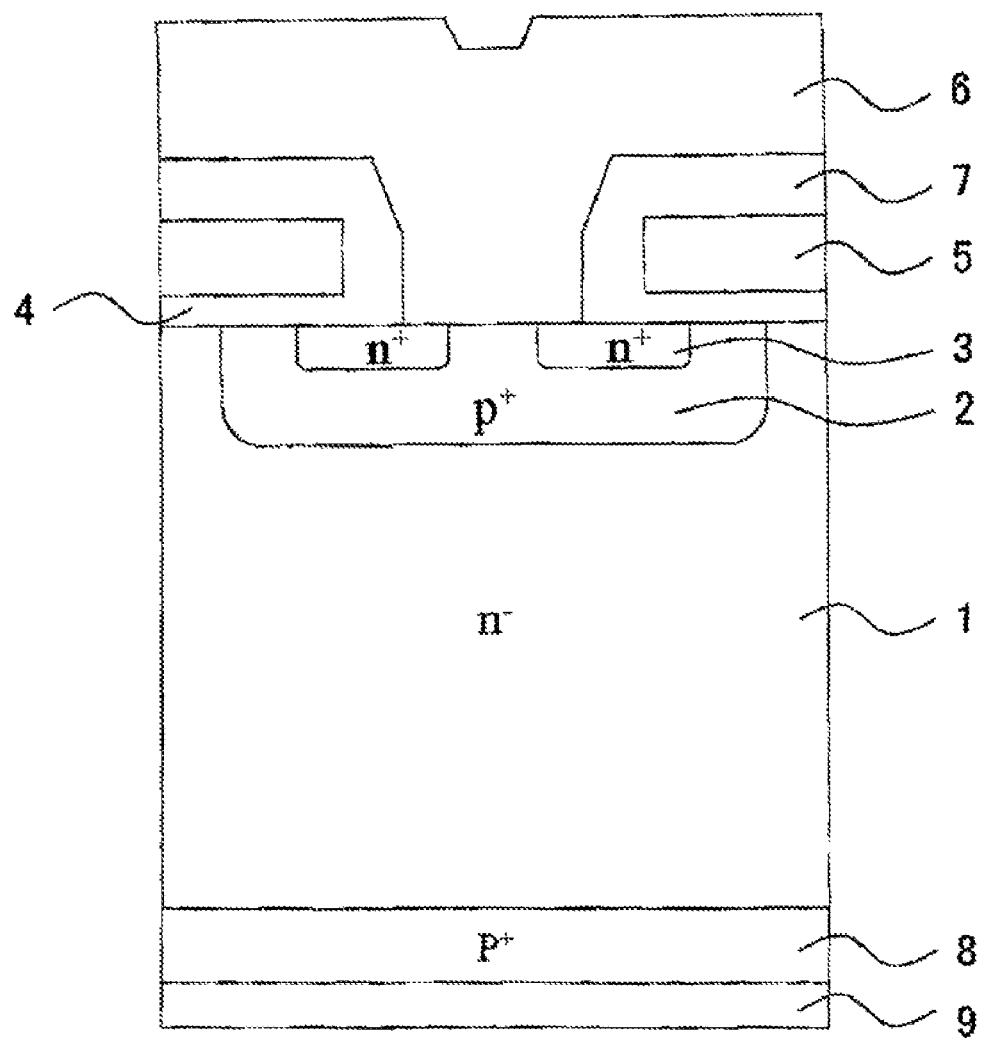
FIG. 5 is a sectional view of a structure of a non-punch-through (NPT) type IGBT.
Figure 6:
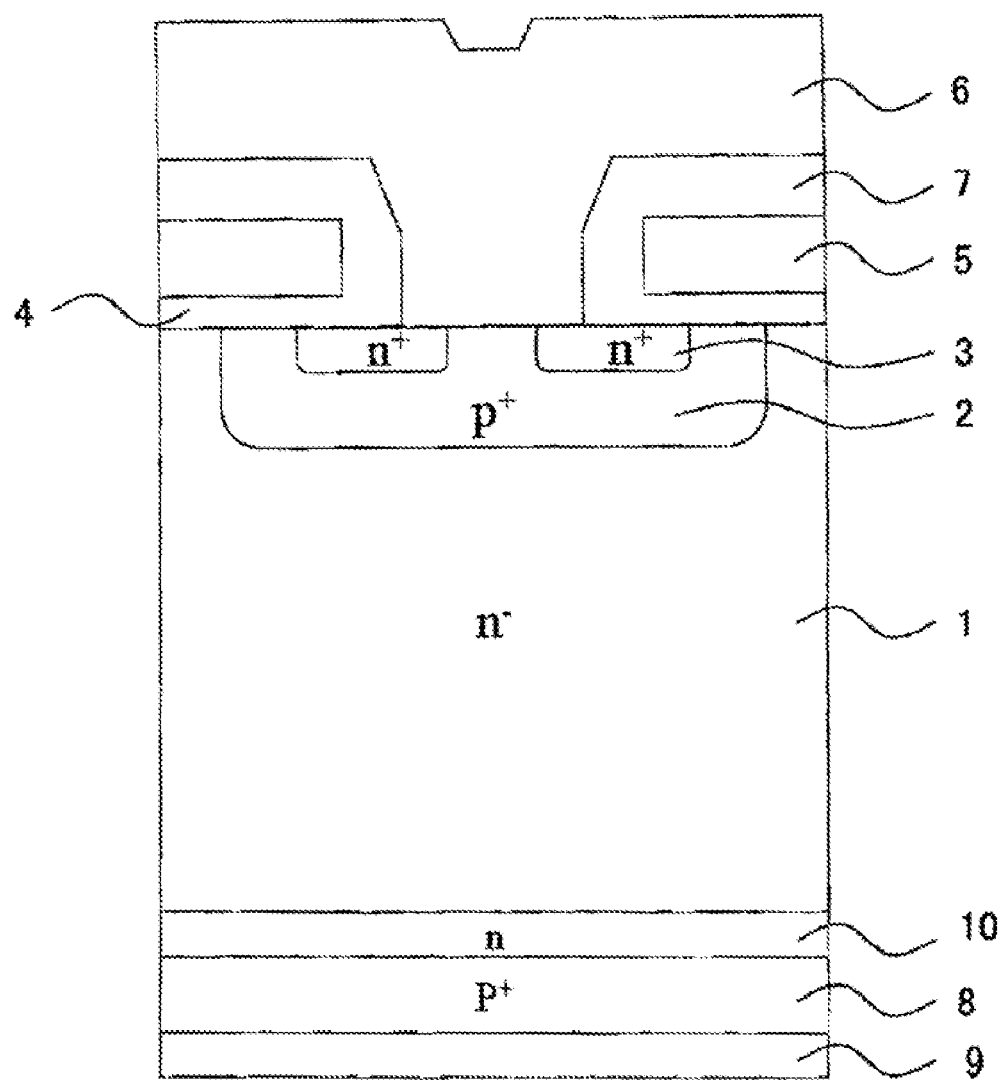
FIG. 6 is a sectional view of a structure of a field stop (FS) type IGBT.

The members in FIG. 2 having the same constitution as in FIG. 6 are given the same symbols and the description thereof is omitted. Referring to FIG. 2, the reference numeral 1 designates an n type FZ substrate that is an n− drift layer. The n− drift layer works as an active layer. The reference numeral 2 designates a p+ base region, 3 an n+ emitter region, 4 a gate oxide film, 5 a gate electrode, 6 an emitter electrode, and the reference numeral 7 designates an interlayer insulation film. These members construct a front surface structure formed on the front surface side of substrate 1.

Emitter electrode 6 is formed of a metallic film of an alloy composed mainly of aluminum in this example. The aluminum alloy can be an aluminum-silicon alloy. The aluminum-silicon contains silicon in the range of from 0.5 wt % to 2 wt %, more preferably at most 1 wt %. An aluminum spike is formed in the process of forming an aluminum layer and the process of heat treatment after forming the aluminum layer, in which aluminum penetrates from the aluminum layer into the underlying semiconductor substrate of silicon. If this aluminum spike reaches a pn junction of between p+ base region 2 and n+ emitter region 3, degradation of electric performance of the FS type IGBT occurs.

Use of the emitter electrode composed of the aluminum-silicon layer containing silicon improves adhesiveness between the emitter electrode of the aluminum-silicon layer and the FZ substrate and prevents the aluminum spike from extending into the semiconductor substrate.

Emitter electrode 6 composed of aluminum-silicon can be formed by means of an evaporation method or a sputtering method. On the surface of emitter electrode 6, nickel plating layer 11 and gold plating layer 12 are provided. As an emitter electrode of an FS type IGBT, nickel plating layer 11 and gold plating layer 12 are included in the emitter electrode. The description here, however, is made separating nickel plating layer 11 and gold plating layer 12 from emitter electrode 6 of aluminum-silicon. A method of forming nickel plating layer 11 and gold plating layer 12 will be described in detail afterwards.

In the rear surface side of FZ substrate 1 are provided: a p+ collector layer, n buffer layer 10 between n− drift layer (an FZ substrate) 1 and p+ collector layer 8, and collector electrode 9.

Collector electrode 9 is a lamination consisting of aluminum, titanium, nickel and gold deposited in this order on p+ collector layer 8. (This detailed structure is not shown in the figure.) Before laminating this metallic layer, a natural oxidation film formed on the surface of p+ collector layer 8 is preferably removed with diluted hydrofluoric acid.

The aluminum layer in this metallic layer is preferably composed of aluminum-silicon containing silicon with a content from 0.5 wt % to 2 wt %, more preferably at most 1 wt %. This aluminum-silicon is used for avoiding the aluminum spike. The aluminum spike is formed in the process of forming an aluminum layer or in a heat treatment process after forming the aluminum layer, in which aluminum penetrates from the aluminum layer into the underlying semiconductor substrate of silicon. If this aluminum spike pierces through the pn junction between n buffer layer 10 and p+ collector layer 8 in the rear surface side of the FS type IGBT, degradation of electric performance, for example increase in leakage current is caused in the FS type IGBT. An aluminum layer composed of an aluminum-silicon layer containing silicon prevents the aluminum spike from extending into the underlying semiconductor surface.

In the metallic layer of electrode formed by means of an evaporation method or a sputtering method, the nickel layer is apt to exhibit a large film stress and thus formed relatively thin in order to reduce this stress, for example with a thickness of about 0.7 μm. The nickel layer, together with the overlying gold layer, melts into a solder in the soldering step in the packaging process. Since adhesiveness between the aluminum layer of aluminum-silicon and a solder is poor, a titanium layer is provided between the aluminum layer and the nickel layer. The nickel layer is provided for solder joining to an external terminal (not shown in FIG. 2). The gold layer on the nickel layer is provided to inhibit oxidation of the nickel layer.

The aluminum layer is occasionally omitted.

The metallic layer of collector electrode 9 is formed by means of an evaporation method, or can be formed by means of a sputtering method. Collector electrode 9 is formed on the whole of the rear surface of FZ substrate 1 and does not need patterning. Since a plurality of metal films is successively formed, productivity can be improved by employing the evaporation method or the sputtering method.

Now, a description is made for a method of manufacturing a semiconductor device referring to FIG. 1, which is a flow chart showing steps of a method of manufacturing a semiconductor device according to the invention. FIG. 3 shows sectional views in the processes corresponding to the successive steps of the flow chart of FIG. 1.

Referring to FIG. 1, step S101 forms a front surface structure comprising, as shown in FIG. 2, p+ base region 2, n+ emitter region 3, gate oxide film 4, gate electrode 5, emitter electrode (a first electrode) 6, and interlayer insulation film 7 on the front surface side of FZ substrate 1.

Then in step S102, the rear surface side of FZ substrate 1 is ground (back-grinding) to reduce the thickness of FZ substrate 1. For example, FZ substrate 1 with a thickness of 600 µm is ground to about 120 µm.

In order to eliminate the damages on the substrate surface such as strain caused by the grinding process, the rear surface side of FZ substrate 1 is removed by an etching process. The etching process removes a thickness of 20 µm, for example. Although the etching process can be carried out by either wet etching or dry etching, a wet etching is conducted in this example in step S103.

A spin etcher is used in step S103 to avoid damage on the front surface side of substrate 1 by the etching process. A mixed acid mainly composed of nitric acid and sulfuric acid can be used as the etchant.

A cross section of the substrate after completion of the steps up to this step is shown by the sectional view indicated as "S101-S103" in FIG. 3. FIG. 3 omits to depict p+ base region 2, n+ emitter region 3, gate oxide film 4, and gate electrode 5.

Then in step S104, two types of ions are successively injected (ion-implantation) to the rear surface side of the FZ substrate 1, which has been made clean after completion of the etching process. After the ion-implantation, an activating heat treatment is conducted to form n buffer layer 10 and p+ collector layer 8 on the rear surface side of semiconductor substrate 1 in step S105.

A natural oxidation film formed on the surface of p+ collector layer 8 is removed with diluted hydrofluoric acid in step S106.

Then, in step S107, collector electrode 9 (a second electrode) is formed by depositing a metallic layer on the surface of p+ collector layer 8 by means of an evaporation method or a sputtering method. The metallic layer laminated on the surface of the p+ collector layer is, for example, a lamination of aluminum, titanium, nickel, and gold deposited in this order.

The aluminum layer in the metallic layer is preferably an aluminum-silicon layer containing silicon in a content from 0.5 wt % to 2 wt %, more preferably at most 1.0 wt %. Containment of silicon prevents an aluminum spike from extending to the underlying semiconductor substrate. The titanium layer prevents the overlying nickel solder from diffusing to the aluminum layer of aluminum-silicon. The nickel layer is provided for solder joining to an external electrode (not shown in FIG. 3), and the gold layer deposited on the nickel layer is provided to avoid oxidation of the nickel layer.

A cross section of the substrate after completion of the steps up to this step is shown by the sectional view indicated as "S104-S107" in FIG. 3. FIG. 3 omits to depict p+ collector layer 8, n buffer layer 10, and a detailed layer structure of collector electrode 9.

Then, in step S108, curing resin 14 is applied on the surface of collector electrode 9. An ultraviolet curing resin is used for the curing resin in this example. The following description is made on ultraviolet curing resin 14A that is an example of curing resin 14. First, ultraviolet curing resin 14A is applied by means of a spin coating method to a thickness of 35 µm, for example, in step S108. The ultraviolet curing resin can be selected, for example, from UV hardening adhesive manufactured by Norland Products Inc., UV hardening adhesive manufactured by EMI (Electronics Materials Inc.), and UV hardening adhesive manufactured by Electro-Lite Corporation.

Then, in step S109, rear surface protecting film 15 is stuck on the surface of uncured ultraviolet curing resin 14A. Rear surface protecting film 15 is an ultraviolet light transmissive film having a thickness in the range of 10 µm to 50 µm, and can be, for example, an aromatic polyamide film, a poly(phenylene sulfide) (PPS) film, a polyamide film, or a poly(ethylene terephthalate) (PET) film. The film needs to exhibit chemical resistance to the plating liquid and heat resistance to a temperature of the plating liquid.

The aromatic polyamide film, the poly(phenylene sulfide) film, and the polyimide film exhibit the heat resistance and the chemical resistance and are suited for application of the present invention. In particular, the polyimide film exhibits excellent heat resistance and chemical resistance and thus, is preferable for application of the invention.

The poly(ethylene terephthalate) film, although less expensive than the other films mentioned above, shows a little poor heat resistance and chemical resistance. The poly(ethylene terephthalate) film is applicable if the immersion time is so short that the agent permeating into the film does not arrive at the curing resin. For, example, a rather cheap poly(ethylene terephthalate) film can be applied in the case the plating layer is thin and consequently the immersion time to the plating liquid is short. If the poly(ethylene terephthalate) film is made to have a large thickness, the time for the agent to penetrate until arrival at the curing resin can be elongated. However, the film becomes more rigid causing difficulty in sticking with the semiconductor substrate.

Then, in step S110, ultraviolet light is irradiated from the side of rear surface protecting film 15 opposite to the surface stuck to curing resin 14 to cure the ultraviolet curing resin 14A. With interleaving cured ultraviolet curing resin 14A, rear surface protecting film 15 adheres to collector electrode 9.

Now, the ultraviolet curing resin is described. The ultraviolet curing resin is mainly composed of urethane oligomer or acrylic oligomer. Viscosity of the resin before curing is adjusted by adding urethane monomer or acrylic monomer. Further, a photo-polymerization initiator is added to cure by irradiation of ultraviolet light.

Ultraviolet curing resin 14A is completely cured through cross-linking reaction between the oligomer and the monomer in a very short time. A film with a thickness of about 35 µm as mentioned above can be cured in about 10 seconds by irradiation of ultraviolet light with an intensity of 200 mW/cm$^2$.

Then, in step S111, nickel plating layer 11 and gold plating layer 12 are laminated on the surface of emitter electrode 6 on the front surface side of semiconductor substrate 1 by an electroless plating method. The electroless plating process in step 111 successively deposits nickel plating layer 11 and gold plating layer 12 on the surface of emitter electrode 6 on the front surface side of semiconductor substrate 1. Nickel plating layer 11 has a thickness of 5 µm, and gold plating layer 12 has a thickness of 0.03 µm, for example.

The nickel plating layer melts in the solder in the soldering step in the packaging process. However, since the nickel plating layer is thicker than the nickel layer in the metallic layer forming the collector electrode, a process design can be arranged so that the nickel plating layer remains with a thickness of about 2 µm, for example, after soldering step in the packaging process. The process design includes, for example, a treatment time for obtaining a desired thickness of the nickel plating layer based on the precipitation speed of the nickel plating layer. According to this process design, the nickel plating layer only partly melts in the soldering step, preventing the solder from reaching the aluminum layer, which exhibits poor adhesiveness.

A cross section of the substrate after completion of the steps up to this step is shown by the sectional view indicated as "S108-S111" in FIG. 3.

In step S111 of the above-described example, the plating step is carried out by the electroless plating method. The plating process is not limited to the electroless plating, but can also be carried out by an electrolytic plating method. A plating layer in the electrolytic plating is formed on a part with which an electrode for feeding an electric current through the plating liquid is in contact. After forming the collector electrode 9, an under barrier metallic layer (UBM layer) is formed by a sputtering method on the front surface side of the semiconductor substrate as an electrode for the electrolytic plating on the front side surface. The UBM layer can be formed of titanium, nickel, chromium, or copper. After that, a resist is applied and the following patterning process leaves only the parts of the resist on which the plating layer on the front surface side is not to be formed. At this time, a curing resin is applied on the collector electrode side and a rear surface protecting film is put on the curing resin without a gap and then, the curing resin is cured. Then, electrolytic plating is conducted using an electrode of the UBM layer to form a plating layer (an electrolytic nickel plating layer and an electrolytic gold plating layer) with a desired thickness. After that, the resist on the front surface is peeled off and the UBM layer other than the plating layer is removed by etching.

The UBM layer, being formed by an evaporation method or a sputtering method, may be formed unintentionally on the side plane of the semiconductor substrate, making electric continuity to the collector electrode. If the process proceeds to the next electrolytic plating step without protecting the collector electrode, an unintended electrolytic layer is formed on the collector electrode.

However, in the process of the invention, the collector electrode side is covered with the curing resin layer and the rear surface protecting film before proceeding to the electrolytic plating step, preventing the collector electrode from becoming into contact with the plating liquid. Therefore, the deposition of an unintended plating layer on the collector electrode 9 is avoided.

The step of forming the curing resin, the step of sticking the rear surface protecting film, and the step of curing the curing resin can be conducted at any time before the electrolytic plating step. For, example, those steps can be conducted just before forming the UBM layer or just before applying the resist on the front surface side. However, considering continuity of steps on the front surface side, it is efficient to conduct those steps just before the electrolytic plating step.

The curing process of the ultraviolet curing resin 14A may occasionally generate large internal stress to warp the semiconductor substrate in great extent. In order to avoid such a situation, annealing for stress relaxation is conducted after sticking rear surface protecting film 15 on ultraviolet curing resin 14A and irradiating with ultraviolet light to cure ultraviolet curing resin 14A. The annealing is conducted at a temperature not higher than 350° C., for example. If the annealing is conducted at a temperature high than the curing temperature (350° C.) of the polyimide film used as the protective film for the front surface structure, the internal stress of the polyimide changes, warping the semiconductor substrate.

Then, a peeling tape is stuck on the rear surface protecting film 15 and subsequently peeled off to peel off the adhesive layer of ultraviolet curing resin 14A together with rear surface protecting film 15 simultaneously from the rear surface side of substrate 1 in step S112.

The steps up to this step completes the process of forming nickel plating layer 11 and gold plating layer 12 on the surface of the first electrode of emitter electrode 6.

In step S112, the adhesiveness between the ultraviolet curing resin 14A and rear surface protecting film 15 is made higher than the adhesiveness between collector electrode 9 and ultraviolet curing resin 14A. This condition ensures simultaneous peeling off of ultraviolet curing resin 14A and rear surface protecting film 15 from the rear surface side of substrate 1.

In order to make the adhesiveness between ultraviolet curing resin 14A and rear surface protecting film 15 be higher than the adhesiveness between collector electrode 9 and ultraviolet curing resin 14A, the materials of ultraviolet curing resin 14A and rear surface protecting film 15 are appropriately selected. Alternatively, the surface of rear surface protecting film 15, on which surface the ultraviolet curing resin is adhered, is subjected to a treatment that enhances adhesiveness.

Selection of such an ultraviolet curing resin that enhances the adhesiveness between ultraviolet curing resin 14A and rear surface protecting film 15 may simultaneously result in enhancement of the adhesiveness between ultraviolet curing resin 14A and collector electrode 9, causing difficulty in peeling off ultraviolet curing resin 14A together with rear surface protecting film 15. Adjustment of the adhesiveness can be performed by a method in which the adhesiveness between collector electrode 9 and ultraviolet curing resin 14A is selected at a desired strength, and the adhering surface of rear surface protective film 15 is subjected to an appropriate machining or treatment to obtain an adhesiveness between ultraviolet curing resin 14A and rear surface protecting film 15 stronger than the adhesiveness between collector electrode 9 and ultraviolet curing resin 14A.

The adhesiveness between collector electrode 9 and ultraviolet curing resin 14A needs to be selected at such a strength that the lamination of rear surface protecting film 15 and ultraviolet curing resin 14A does not separate from collector electrode 9 in the plating step of S111.

The treatment on the adhering surface of rear surface protecting film 15 can be a treatment for improving wettability of the surface of the adhering surface side of rear surface protecting film 15. The treatment can be a corona discharge process on the adhering surface side of rear surface protecting film 15.

In the surface treatment by corona discharge, a high frequency high voltage is applied between a dielectric material such as a film and an electrode insulated from the dielectric material to generate corona discharge between the dielectric material and the electrode. The generated corona activates oxygen in the air, and the oxygen breaks the molecular chain of the dielectric material and enters the dielectric material to generate polar groups such as $C=O$, COOH, and C—OH. In addition, collisions of high energy electrons generate irregularities on the surface of the dielectric material. Thus, the surface is modified.

The energy of corona discharge acting on a substance makes the surface of the substance, receiving the energy, into an elevated surface energy state, that is, an activated state (a radical state). In the rear surface protecting film, polar groups such as carbonyl groups are generated to improve wettability.

When the surface of the film is adhered to the curing resin in the activated state of the surface as described above, the adhesiveness is greatly enhanced.

If the rear surface protecting film subjected to the surface treatment by the corona discharge is left exposed to the air for a long time, the surface energy gradually decreases and returns to the original low energy state through reaction with the molecules in the air. For this reason, it is preferable for the surface subjected to the surface treatment by corona discharge to proceed soon to the next step of adhering to the curing resin before the surface energy decreases.

The adjustment of the adhesiveness as described above enables simultaneous peeling off of ultraviolet curing resin 14A and rear surface protecting film 15 from the rear surface side of substrate 1.

In the above-described example, an ultraviolet curing resin is used for a curing resin. In place of the ultraviolet curing resin, thermosetting resin 14B can also be used. FIG. 4 is a flow chart showing steps of another method of manufacturing a semiconductor device according to the invention. The procedure of FIG. 4 differs from that of FIG. 1 in that curing resin 14 applied in the step S108 is thermosetting resin 14B and in that the way of curing the curing resin in step S120 is heat in place of ultraviolet light irradiation.

In step S105, a heat treatment has been conducted for activating the ion-implanted impurities. And the polyimide film for protecting the front surface structure has been cured. The both heating processes are conducted at about 350° C. If the heating process for curing thermosetting resin 14B is conducted at a temperature higher than 350° C., the heating process would change the concentration distribution in n buffer layer 10 and p+ collector layer 8 formed in the rear surface side of semiconductor substrate 1, failing to giving desired characteristics of the semiconductor element. In addition, the heat treatment in this step conducted at a temperature higher than the curing temperature (350° C.) of the protective film of polyimide would change the internal stress of the polyimide, resulting in warping of the semiconductor substrate. Therefore, it is necessary for thermosetting resin 14B preferably to finish the cross-linking reaction at a temperature not higher than 350° C.

In this example, a thermosetting resin is used for curing resin 14 on the surface of collector electrode 9. First in step S108, thermosetting resin 14B is applied to a thickness of 35 μm, for example, by means of a spin coating method. Thermosetting resin 14B can be a thermosetting adhesive manufactured by EMI (Electronics Materials Inc.), for example.

Then, in step 109, rear surface protecting film 15 is stuck on the surface of uncured thermosetting resin 14B. Rear surface protecting film 15 is a heat resistant film having a thickness in the range of 10 μm to 50 μm, for example, and an aromatic polyamide film, a poly(phenylene sulfide) (PPS) film, a poly(ethylene terephthalate) (PET) film, or a polyimide film. The film needs chemical resistance to the plating liquid, thermal resistance to the temperature of the plating liquid, and further, thermal resistance to heat treatment for curing the thermosetting resin. The polyimide film, in particular, exhibits excellent thermal resistance and chemical resistance, and thus preferable.

Then, in step S120, a surface of rear surface protecting film 15 opposite to the surface to which thermosetting resin 14B is adhered, is put on a hot plate at 150° C. and left for 3 minutes to cure thermosetting resin 14B. Alternatively, rear surface protecting film 15 with the adhered thermosetting resin 14B can be put into a furnace at about 150° C. for 30 minutes to cure thermosetting resin 14B. By curing thermosetting resin 14B, collector electrode 9 and rear surface protecting film 15 are adhered interleaving thermosetting resin 14B therebetween.

Here, the thermosetting resin is described more specifically. The thermosetting resin is mainly composed of urethane oligomer or acrylic oligomer. The viscosity of the resin before curing is adjusted by adding urethane monomer or acrylic monomer. Further, a thermal polymerization initiator is added for thermal curing.

The relation of adhesiveness among collector electrode 9, the thermosetting resin, and the rear surface protecting film and adjustment of the adhesiveness are the same as in the case of the ultraviolet curing resin, described previously.

Description is made in the following concerning the case in which the semiconductor substrate has warped during the steps up to S107 shown in FIG. 1, FIG. 4 and FIG. 3. The semiconductor substrate is made thin in step S102 of rear surface grinding step and step S103 of rear surface etching step, and during the steps up to S107 of the rear surface electrode deposition step, the semiconductor substrate warps. When the semiconductor substrate becomes thinner than 200 μm, for example 100 μm, the substrate tends to warp. In a 6 inch semiconductor substrate, for example, a bulge of about 5 mm occurs on the front surface structure side. In this condition, a curing resin is spin coated on the collector electrode 9 and a rear surface protecting film is stuck thereon. If rigidity of the rear surface protecting film is high, the rear surface protecting film does not deform following the warp of the semiconductor substrate. The semiconductor substrate is once stuck to the rear surface protecting film in a state deformed by the adhesive force with the uncured curing resin. Because the semiconductor substrate originally warped, the restoring force, that is a force to restore the warped state, exceeds the adhesive force between the semiconductor substrate and the uncured curing resin, separating the semiconductor substrate from the rear surface protecting film.

Therefore, the rear surface protecting film has preferably such a rigidity that allows deformation that follows the warping configuration of the semiconductor substrate in the process of sticking between the warped semiconductor substrate and the uncured curing resin. Preferable rigidity is such a value that keeps the rear surface protecting film in a deformed configuration until the curing resin finishes curing, owing to an adhesive force between the semiconductor substrate and the curing resin and an adhesive force between the curing resin and the rear surface protecting film against the restoring force (a force tending to return to the warped configuration) of the semiconductor substrate.

A thickness of the rear surface protecting film to obtain a rigidity required by the rear surface protecting film is, depending on the material of the film, in the range of 10 μm to 50 μm in the aromatic polyamide film and the poly(phenylene sulfide (PPS) film, for example. A thick curing resin causes disadvantages that the resin drips and sticks to undesired places in the spin coating process, and takes time to cure the resin. Of course, the increased amount of applied resin raises the cost. Therefore, it is sufficient for the curing resin to have a minimum thickness for achieving a desired adhesiveness, and the thickness is favorably in the range of 10 μm to 40 μm.

The ultraviolet curing resin and the thermosetting resin do not contain an organic solvent like ordinary adhesives. The monomer used for adjusting viscosity of the curing resin does not evaporate in the curing step of the resin and reacts with the oligomer by cross-linking, to become a component of the cured resin. Therefore, these curing resins immersed in a plating liquid do not have a problem of contamination of the plating liquid due to an organic solvent.

Since most of the curing resin is covered with the rear surface protecting film, the curing resin rarely exposes to the agent of the plating liquid in the plating step. Therefore, when a film is used that exhibits a sufficient chemical resistance against the agent, an inexpensive curing resin can be used that exhibits less chemical resistance than the film.

The description thus far is made on the examples applied to the FS type IGBT. However, the invention is not limited to those examples, but applicable to other types of IGBTs, power MOSFETs, and FWDs.

The above description is made on the nickel plating layer and the gold plating layer deposited on the emitter electrode of the FS type IGBT. However, metallic layers formed by plating in the invention are not limited to those examples, but includes plating of, for example: electroless nickel-phosphorus alloy plating, substituted gold plating, electroless gold plating, electroless nickel-palladium-phosphorus alloy plating, electroless nickel-boron alloy plating, electroless nickel-phosphorus-PTFE (a fluorine-containing resin) composite plating, electroless nickel-boron-graphite composite plating, electroless copper plating, electroless silver plating, electroless palladium plating, electroless platinum plating, electroless rhodium plating, electroless ruthenium plating, electroless cobalt plating, electroless cobalt-nickel alloy plating, electroless cobalt-nickel-phosphorus alloy plating, electroless cobalt-tungsten-phosphorus alloy plating, electroless cobalt-tin-phosphorus alloy plating, electrodes cobalt-zinc-phosphorus alloy plating, electroless cobalt-manganese-phosphorus alloy plating, electroless tin plating, and electroless solder plating.

The above description is made on the examples of forming a plating layer on the surface of an emitter electrode. However, the plating layer is not limited to forming on the emitter electrode, but the plating layer can be formed on a gate electrode of an IGBT in the same way as or at the same time with the emitter electrode. Further, a plating layer can be formed on the surface of the collector electrode of an IGBT after sticking a protective film on the front surface side intervening a curing resin. Moreover, a plating layer can be formed on the surface of the anode electrode and a cathode electrode of a diode (FWD).

In the above description, the metal underlying the plating layer is aluminum-silicon. However, a metallic material underlying the plating layer is not limited to the example, but a construction is possible in which a nickel layer is formed on the aluminum-silicon layer by means of evaporation method or a sputtering method and a plating layer is formed thereon.

Thus, a method of manufacturing a semiconductor device has been described according to the present invention. Many modifications and variations may be made to the techniques and methods described and illustrated herein without departing from the spirit and scope of the invention. Accordingly, it should be understood that the methods described herein are illustrative only and are not limiting upon the scope of the invention.

This application is based on, and claims priority to, Japanese Patent Application No. 2009-023833, filed on Feb. 4, 2009 contents of which are incorporated herein by reference. The disclosure of the priority application in its entirety, including the drawings, claims, and the specification thereof, is incorporated herein by reference.

ELEMENTS IN DRAWINGS

1: semiconductor substrate (FZ substrate, n− drift layer)
2: p+ base region
3: n+ emitter region
4: gate oxide film
5: gate electrode
6: emitter electrode
7: interlayer insulation film
8: p+ collector layer
9: collector electrode
10: n buffer layer
11: nickel plating layer
12: gold plating layer
14: curing resin

What is claimed is:

1. A method of manufacturing a semiconductor device comprising steps of:
   forming a semiconductor element on a semiconductor substrate;
   forming a first electrode on a first principal surface of the semiconductor substrate;
   forming a second electrode on a second principal surface of the semiconductor substrate;
   applying a curing resin on the second electrode;
   adhering a film to the curing resin;
   curing the curing resin after adhering the film;
   plating on the first electrode; and
   peeling off the film and the curing resin from the second electrode after the step of plating.

2. The method of manufacturing a semiconductor device according to claim 1, wherein an adhering force between the curing resin after curing and the film is greater than an adhering force between the curing resin after curing and the second electrode.

3. The method of manufacturing a semiconductor device according to claim 2, further comprising a step of preliminarily treating a surface of the film on which the curing resin is to be adhered, for enhancing adhesiveness of the film with the curing resin, before the step of adhering the film to the curing resin.

4. The method of manufacturing a semiconductor device according to claim 3, wherein the step of treating the surface of the film for enhancing adhesiveness is carried out by corona discharge on the surface on which the curing resin is to be adhered.

5. The method of manufacturing a semiconductor device according to claim 1, wherein the film has a rigidity allowing deformation that follows a warping configuration of the semiconductor substrate.

6. The method of manufacturing a semiconductor device according to claim 5, wherein the semiconductor substrate has a thickness at most 200 μm.

7. The method of manufacturing a semiconductor device according to claim 1, wherein the film is made of a material selected from the group consisting of polyimide, poly(phenylene sulfide), poly(ethylene terephthalate), and aromatic polyamide.

8. The method of manufacturing a semiconductor device according to claim 1, wherein the curing resin is an ultraviolet-curing resin or a thermosetting resin.

9. The method of manufacturing a semiconductor device according to claim 8, wherein the step of applying the curing resin on the second electrode is conducted by applying, on a surface of the second electrode, a curing resin containing an oligomer selected from an urethane oligomer and an acrylic oligomer, a monomer selected from an urethane monomer and an acrylic monomer, and a polymerization initiator selected from a photo-polymerization initiator and a thermo-polymerization initiator.

10. The method of manufacturing a semiconductor device according to claim 1, wherein the step of plating forms a plurality of plating layers on the first electrode.

11. The method of manufacturing a semiconductor device according to claim 10, wherein the step of plating includes at least one of a process of forming an electroless nickel plating layer and a process of forming an electrolytic nickel plating layer.

12. The method of manufacturing a semiconductor device according to claim 1, wherein the first electrode is mainly composed of aluminum.

* * * * *